United States Patent
Campi, Jr. et al.

(10) Patent No.: US 9,041,127 B2
(45) Date of Patent: May 26, 2015

(54) FINFET DEVICE TECHNOLOGY WITH LDMOS STRUCTURES FOR HIGH VOLTAGE OPERATIONS

(71) Applicant: International Business Machines Corporation, Armonk, NY (US)

(72) Inventors: John B. Campi, Jr., Westford, VT (US); Robert J. Gauthier, Jr., Hinesburg, VT (US); Junjun Li, Williston, VT (US); Rahul Mishra, Essex Junction, VT (US); Souvick Mitra, Essex Junction, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 13/893,466

(22) Filed: May 14, 2013

(65) Prior Publication Data
US 2014/0339649 A1    Nov. 20, 2014

(51) Int. Cl.
*H01L 29/76* (2006.01)
*H01L 29/78* (2006.01)

(52) U.S. Cl.
CPC .......... *H01L 29/785* (2013.01); *H01L 29/7816* (2013.01)

(58) Field of Classification Search
USPC .................................. 257/343, 409, 491, 493
See application file for complete search history.

(56) References Cited

U.S. PATENT DOCUMENTS

| | | | |
|---|---|---|---|
| 6,137,140 A | 10/2000 | Efland et al. | |
| 6,876,035 B2 | 4/2005 | Abadeer et al. | |
| 7,151,296 B2 | 12/2006 | Wu et al. | |
| 7,208,794 B2 | 4/2007 | Hofmann et al. | |
| 7,297,582 B2 | 11/2007 | Abadeer et al. | |
| 7,696,565 B2 | 4/2010 | Donze et al. | |
| 7,750,401 B2 | 7/2010 | Cai | |
| 7,812,393 B2 | 10/2010 | Williams et al. | |
| 7,977,715 B2 | 7/2011 | Cai | |
| 8,004,038 B2 | 8/2011 | Chien et al. | |
| 8,367,498 B2 | 2/2013 | Chang et al. | |
| 2007/0267693 A1 | 11/2007 | Chien et al. | |
| 2008/0237705 A1 | 10/2008 | Theeuwen et al. | |

(Continued)

OTHER PUBLICATIONS

Basker, "A 0.063 μm2 FinFET SRAM cell demonstration with conventional lithography using a novel integration scheme with aggressively scaled fin and gate pitch", 978-1-4244-7641-1/10, © 2010 IEEE, 2010 Symposium on VLSI Technology Digest of Technical Papers, pp. 19-20.

(Continued)

*Primary Examiner* — Thanh V Pham
(74) *Attorney, Agent, or Firm* — Michael Lestrange; Matthew F. Mottice

(57) ABSTRACT

The present invention is a finFET type semiconductor device using LDMOS features. The device includes a first portion of a substrate doped with a second doping type and has a first trench, second trench, and first fin. The second portion of the substrate with a first doping type includes a third trench and second fin. The second fin between the second and third trench covers a part the first portion and a part of the second portion of the substrate. A first segment of the second fin is between the second segment and second trench. A second segment covers a part of the second portion of the substrate and is between the first segment and third trench. A gate covering at least a part of the first segment and a part of the first portion and a part of the second portion of the substrate.

16 Claims, 3 Drawing Sheets

(56) References Cited

U.S. PATENT DOCUMENTS

| | | |
|---|---|---|
| 2010/0006974 A1 | 1/2010 | Xu et al. |
| 2010/0096697 A1 | 4/2010 | Su et al. |
| 2010/0109097 A1 | 5/2010 | Zhang et al. |
| 2010/0202184 A1 | 8/2010 | Lee |
| 2010/0296213 A1 | 11/2010 | Lee et al. |
| 2011/0006369 A1 | 1/2011 | Sonsky et al. |
| 2011/0073962 A1 | 3/2011 | Chu et al. |
| 2011/0207298 A1 | 8/2011 | Anderson et al. |
| 2012/0037984 A1 | 2/2012 | Yu |
| 2012/0049279 A1 | 3/2012 | Shrivastava et al. |
| 2012/0193707 A1 | 8/2012 | Huang et al. |
| 2012/0273882 A1 | 11/2012 | Ratnam |
| 2013/0009246 A1 | 1/2013 | Cheng et al. |

OTHER PUBLICATIONS

Kawasaki, "FinFET Process and Integration Technology for High Performance LSI in 22 nm node and beyond", Ext. Abs. the 7th International Workshop on Junction Technology 2007, 1-4244-1 104-1/07, © )2007 IEEE, pp. 3-7.

FINFET DEVICE TECHNOLOGY WITH LDMOS STRUCTURES FOR HIGH VOLTAGE OPERATIONS

FIELD OF THE INVENTION

The present invention relates generally to the field semiconductor devices, and more specifically, to integrated circuits with fin Field-Effect Transistors (finFET) type devices.

BACKGROUND OF THE INVENTION

Semiconductor devices are used in a large number of electronic devices, such as computers, cell phones, and others. Semiconductor devices are made of integrated circuits that are formed on semiconductor wafers by depositing and patterning many types of thin films of material. Metal-Oxide Semiconductor Field-Effect Transistors (MOSFET) devices are an example of a typical semiconductor device. MOSFET devices generally consist of a source, a drain, a gate and a channel located between the source and drain. A gate stack made of a gate material and a gate oxide, such as silicon oxide, are typically located above the channel. In typical operation, a voltage drop across the gate oxide creates a field effect that induces a conducting channel between the source and drain.

Applications continue to arise that call for higher voltages. MOSFET technologies, such as laterally diffused metal oxide semiconductors (LDMOS) are designed to handle higher voltages. LDMOS devices use a number of features to handle higher voltage. The use of a low doped drift area increases voltage depletion and isolation trenches are used to create a longer circuit path to help dissipate high voltages.

In the manufacture of integrated circuits, there is a growing desire to fit more devices and circuits in each chip. This desire is driven both by miniaturization/space utilization and the goal for increasing speed. In order to meet these desires for increasing speed and smaller sizes, a three dimensional approach such as finFETs has been developed for semiconductor devices. A finFET is a non-planar FET. The fin is a narrow, vertical semiconductor structure creating a channel between the source and the drain, covered by a thin insulating material and surrounded on two or three sides by an overlying gate. FinFETs improve both the density and the gate control of the channel in the device. This three dimensional device structure is being utilized in many types of applications including static random-access memory (SRAM) and logic devices.

SUMMARY

An exemplary embodiment of the present invention is a finFET type semiconductor device using LDMOS features. The device includes a first portion of a substrate, the first portion being doped with a second doping type. The first portion includes a first trench, a second trench, and a first fin between the first trench and the second trench.

The second portion of the substrate is doped with a first doping type. The second portion includes a third trench and a second fin. The second fin is between the second and the third trench. The second fin covers a part the first portion and a part of the second portion of the substrate. A first segment of the second fin is between the second trench and a second segment of the second fin. A second segment of the second fin is covering a part of the second portion of the substrate and is between the first segment of the second fin and the third trench. A gate covering at least a part of the first segment. The gate is covering at least a part of the first portion of the substrate and a part of the second portion of the substrate.

BRIEF DESCRIPTION OF THE SEVERAL VIEWS OF THE DRAWINGS

The following detailed description will best be understood in conjunction with the accompanying drawings. It should be understood that these drawings are not to scale and various features may be increased or reduced for discussion of particular components.

DETAILED DESCRIPTION

Detailed embodiments of the claimed structures and methods are disclosed herein; however, it is to be understood that the disclosed embodiments are merely illustrative of the claimed structures and methods that may be embodied in various forms. Descriptions of well-known components and processing techniques maybe omitted so as to not unnecessarily obscure the embodiments herein. In addition, specific structural and functional details disclosed herein are not to be interpreted as limiting, but merely as a representative basis for teaching one skilled in the art to variously employ the methods and structures of the present disclosure.

As applications arise for higher voltages, challenges occur with respect to current and voltage output characteristics with this traditional MOSFET device. Laterally diffused metal oxide semiconductors (LDMOS) structures have been developed to help alleviate some of the challenges of increasing voltages by increasing the length of the current path between the source and drain. This is done by increasing the drift region between the drain and channel. While effective in relieving some of the challenges created by higher voltages, increasing the drift area also creates larger devices using more semiconductor surface area which is in opposition to the industry direction for smaller devices.

Exemplary embodiments of this invention relate to semiconductor structures and methods of manufacture, and more particularly, to finFET type devices using LDMOS structures for handling higher voltage operations. Three dimensional devices like finFETs and similar multiple gate devices provide advantages in the form of a smaller device footprint, speed, and channel control. Exemplary embodiments of the present invention utilize both finFET technology and attributes of LDMOS, such as isolation trenches and drift regions, for improved electrical function (higher voltage and improved channel control).

Figure 1:
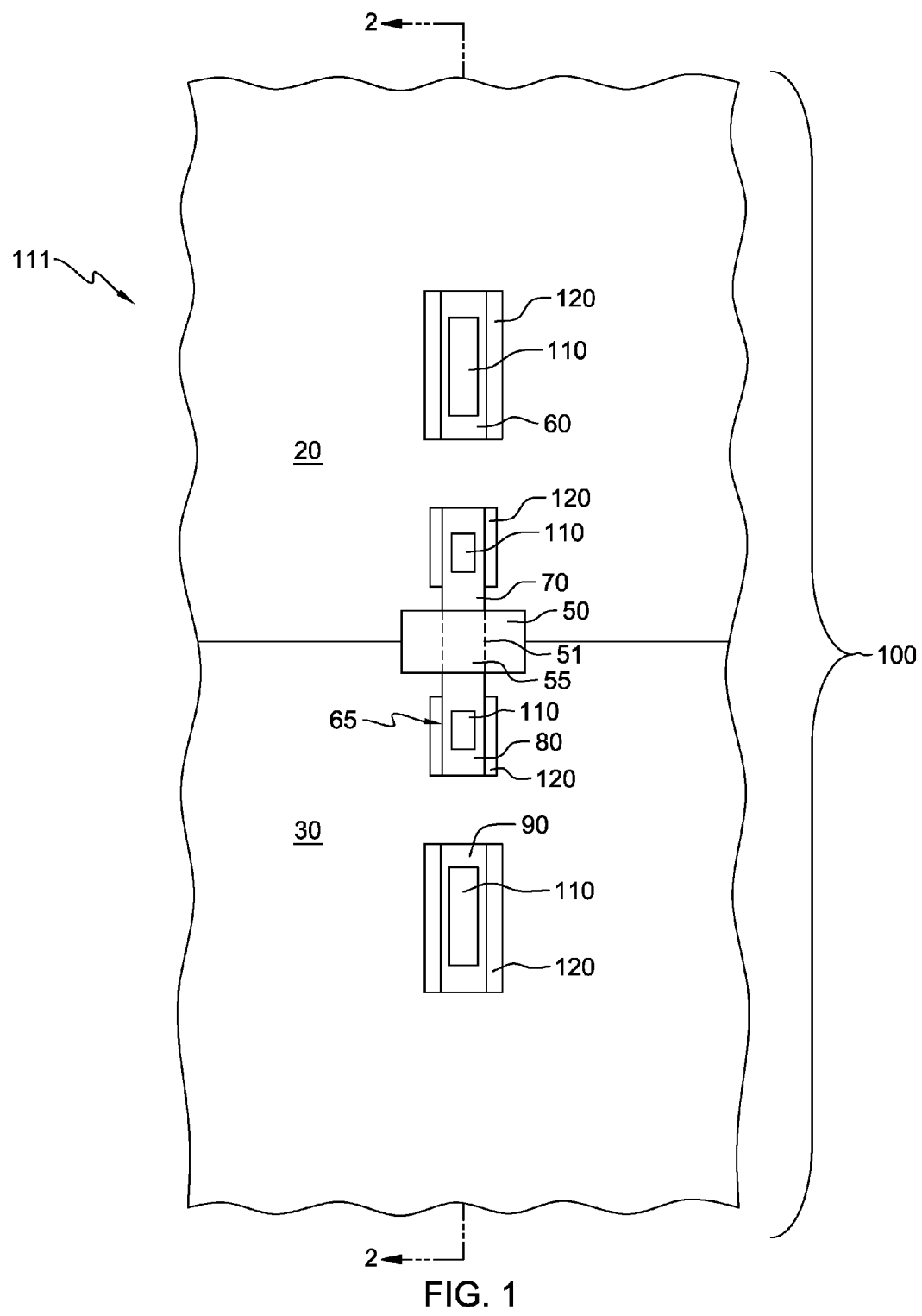
FIG. 1 is a top plan view of an embodiment of a finFET type device as described.

In FIG. 1, a top plan view of an exemplary embodiment of a finFET type device 111 is shown. FinFET type device 111 includes substrate 100, well 20, well 30, gate 50, gate oxide 51, channel 55, drain fin 60, fin 65, fin 90, source 80, float 70, contacts 110 and epitaxial layer (EPI) 120. As depicted in FIG. 1, drain fin 60, fin 65 and fin 90 are arranged about a common centerline, although other applications may have different fin arrangements. In exemplary embodiment of the present invention, drain fin 60, fin 65 and fin 90 are formed with the substantially the same height and width for this embodiment, although drain fin 60, fin 65 and fin 90 could have different height and/or width dimensions in other embodiments.

Figure 2:
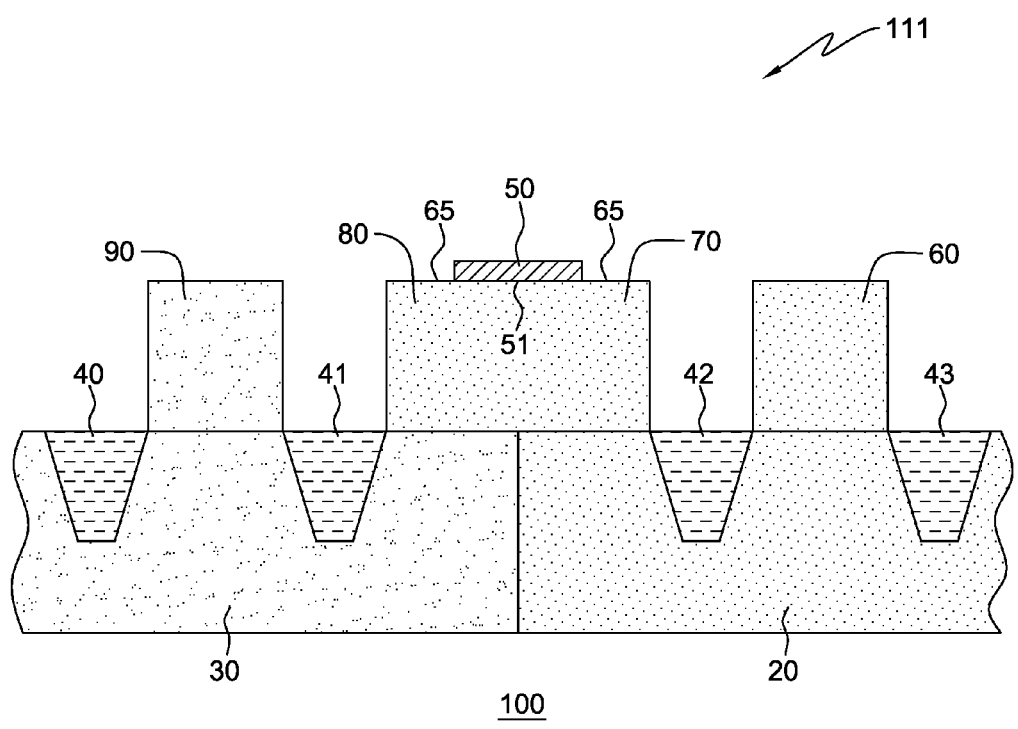
FIG. 2 is a cross-sectional view of the finFET type device of FIG. 1, as described through section 2-2.

In FIG. 2, finFET type device 111 is shown in a cross-sectional view 2-2. Exemplary embodiments of finFET type device 111 are fabricated on a bulk silicon substrate 100, although other semiconductor substrate materials such as germanium or compound semiconductors like silicon carbide, gallium arsenide or indium phosphide could be used. The silicon substrate 100 can be either a n-type or p-type depending on the application.

Drain fin 60, fin 65 and fin 90 are formed on a bulk silicon semiconductor substrate 100 using sidewall image transfer process and double patterning lithography. In one embodiment, drain fin 60, fin 65 and fin 90 are created on a silicon substrate by a lithography process which may include a photoresist application (spin-on coating for example), bake, mask alignment, resist develop/remove, masking material deposit, and etch to form sidewall spacers. Resist is removed and sidewall spacers used for etch mask to create silicon fin. Alternatives to standard lithography and etch would include electron beam, ion beam, maskless photolithography or similar process.

Isolation trenches 40, 41, 42 and 43 are formed on either end of drain fin 60, fin 65 and fin 90. After drain fin 60, fin 65 and fin 90 are formed, the trenches are etched in the substrate 100 and an insulation layer and filler are deposited to form isolation trenches 40, 41, 42 and 43 using standard manufacturing processes. Isolation trench 42 creates a longer electrical path through the drift region (lightly doped well 20) increasing the current path for voltage reduction. In other embodiments of the present invention, isolation trenches can be varying sizes and depths. An exemplary embodiment, as depicted in FIG. 2, uses shallow isolation trenches, although deep isolation trenches can be used. The depth of separate isolation trenches 40, 41, 42 or 43 can be varied for optimal electrical performance.

Well 20 is a lightly doped portion of substrate 100. Well 20 is doped with the second doping type (non-intrinsic, or in this embodiment, n-type). Well 30 is a portion of the substrate 100 lightly doped with the first doping type adjacent to well 30. Well 20 and well 30 may be created by single or multi-step ion implantation, by single or multi-step diffusion process or similar process or process combinations.

As depicted in FIG. 1, an epitaxial layer (EPI) layer 120 can be selectively grown on fins. A semiconductor material such as silicon or another type of semiconductor material can be epitaxially grown on exposed portions of drain fin 60, fin 65 and fin 90. The EPI layer 120 maybe grown by CVD deposition, molecular beam or similar process. EPI layer 120 of fins may be doped during deposition with materials such as phosphorous or implanted after EPI growth (ion implantation for example).

Exemplary embodiments of drain fin 60 and fin 65 are doped with the second type doping while fin 90 is doped with the first doping material. In some exemplary embodiments, a small portion of drain fin 60, fin 65 and fin 90 may not be fully implanted and remain as their original type. Single, double, deep, angled implantation or similar process or combination of processes may be used to heavily dope drain fin 60, fin 65 and fin 90. In some exemplary embodiments, the heavy doping concentrations are of the order $10 \times 10^{20}$ cm$^{-3}$ or greater in drain fin 60, fin 65 and fin 90, although different doping concentrations could be used in other applications.

As shown in FIG. 2, residing on well 20, drain fin 60 is heavily doped with the second doping type. Drain fin 60 is between isolation trench 42 and 43 and functions as a drain for the finFET type device. Fin 60 is created simultaneously with fins 65 and 90, which provides a uniform process flow for source, drain, channel and body contact formation, as all are made with the same fin formation process. Post fin formation processes such as doping, epitaxy or contact formation are the same in the exemplary embodiment of the present invention but may vary in other applications. Use of a separate fin for drain provides not only a unified process flow with finFET formation, but also creates a longer current path to dissipate higher voltages. This allows for higher voltage usage without additional processes that would be used for elevated drain formation, another option for elongating electrical paths.

Fin 65 resides over a potion of both well 20 and well 30 and is heavily doped with the second doping type. Fin 65 is located between isolation trench 41 and isolation trench 42.

A three dimensional finFET type device is created as gate 50 wraps around fin 65. Gate 50 includes a gate oxide 51 formed by industry standard processes such as deposition (chemical vapor deposition, physical vapor deposition, atomic layer deposit, sputtering or similar process), photolithography patterning (including maskless photolithography, electron beam or ion beam patterning) and conventional etch processes. Gate oxide layer 51 is composed of a dielectric material such as silicon dioxide, silicon oxinitride, oxide, high-k dielectric material like halfnium oxide or a combination of these (stack of dielectric materials). In this exemplary embodiment, gate 50 fabricated over the fin 65 and gate material layer is composed of polysilicon. Gate 50 could also be fabricated of amorphous silicon, metal like TiN, TaN or similar material. Gate 50 is on fin 65 creating channel 55 in the fin under gate 50. Gate 50 also resides over a portion of both well 20 and well 30.

A segment of fin 65 is a float 70 which resides between gate 50 and trench 42. Float 70 resides over a part of well 20. Although float 70 is shown in this embodiment, float 70 may not be present in other embodiments. Another segment of fin 65 is source 80. Source 80 resides on well 30 and is between gate 50 and trench 41.

Fin 90 resides over well 30 and is heavily doped with the first type doping. Fin 90 is used as a body contact for this exemplary embodiment of the present invention although it may have other uses in other applications or may not be present. Fin 90 is between trenches 40 and 41.

Figure 3:
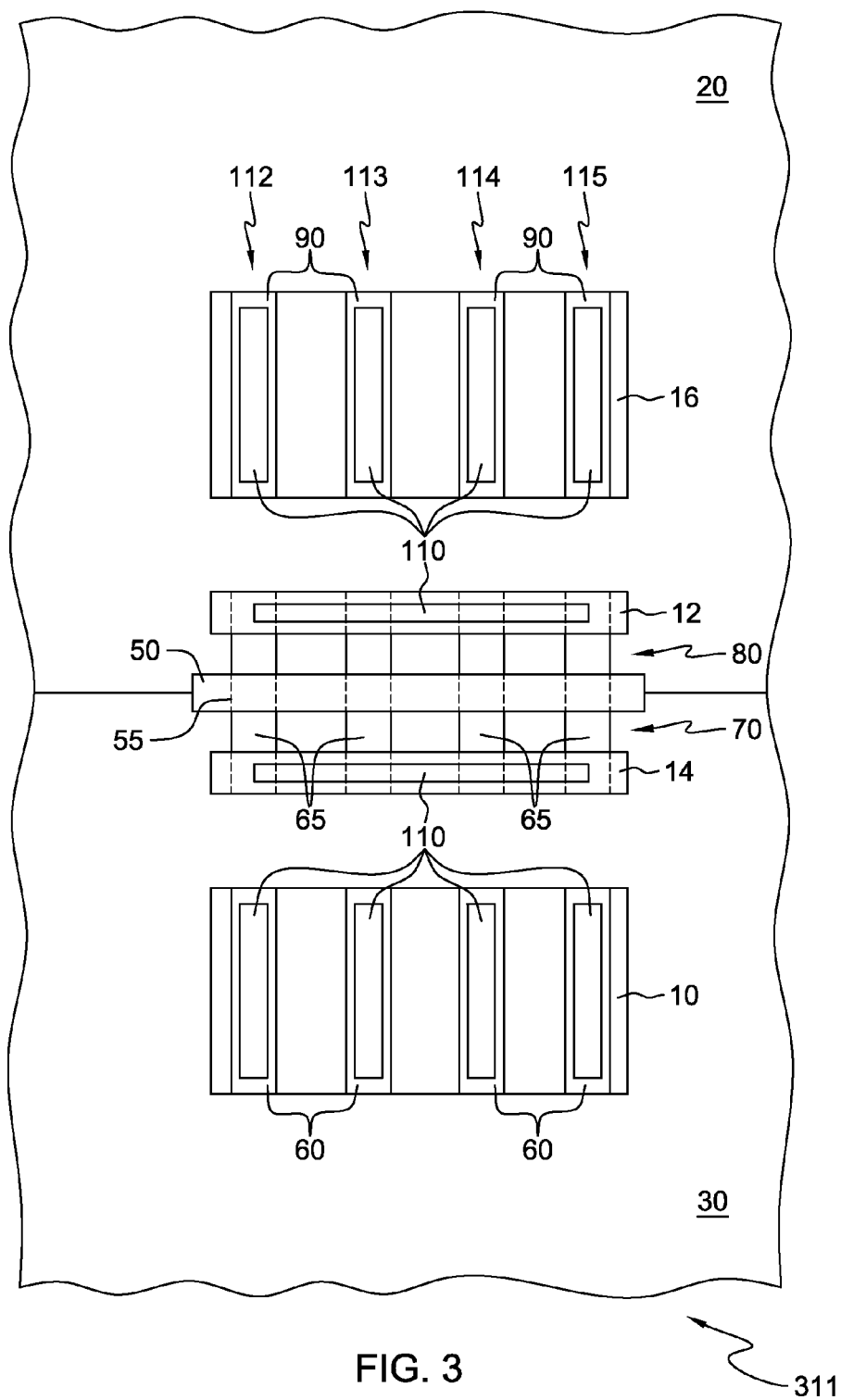
FIG. 3 is a top view of a multi-fingered finFET type device as described.

Contacts 110 reside on a top surface of drain fin 60, fin 65, and fin 90 (shown in FIGS. 1 and 3). In an exemplary embodiment, contacts 110 are formed through standard salicide processes. Contacts 110 provide a location for a physical and electrical connection to the next level wiring, vias or other connections.

In FIG. 3, another embodiment of the present invention is shown. A multiple finFET type device 311 is created with multiple finFET type devices 112, 113, 114 and 115. The structure of finFET type 112 is duplicated multiple times in a substantially parallel orientation for finFET type devices 113, 114, and 115, as shown in FIG. 3. The parallel finFET type devices 112, 113, 114, and 115 are representative. FinFET type device 112 could be replicated once (dual structure) or multiple times. Although FIG. 3, depicts four finFET type devices other exemplary embodiments may include more or less than four finFET type devices (ie. three or five or more parallel finFETs type devices are possible).

Each finFET type device 112, 113, 114, and 115 are created as described previously with the exception that merged EPI layers 10, 12, 14 and 16 on the fins are merged according to function. In other words, merged EPI layer 10 joins the individual drains in the row of drains 60 on the multiple device structures 112, 113, 114 and 115. Similarly, all sources 80 of the row of sources 80 are electrically connected by EPI layer 12 on device structures 112, 113, 114, and 115. Each of floats 70 of the row of floats 70 are connected through EPI layer 14. Similarly, each of the body contacts 90 of the row of body contacts on devices 112, 113, 114 and 115 are electrically connected by EPI layer 16. In the exemplary embodiment of the present invention, each of the rows of functional elements (i.e. drains 60, floats 70, sources 80 and body contacts 90) are connected by function, that is, all sources 80, for example, are electrically connected by merged EPI 12, however, they may be connected by other means or use unmerged EPI in other embodiments. Gate 50 transverses all fins 65 to create a channel 55 in the row of fins 65 in device structures 112, 113, 114 and 115. Multiple finFET type devices provides the advantages outlined before for electrical performance, spacing efficiencies and process uniformity with one silicon fin formation process for drain, source and body contact. Exemplary embodiments of multiple finFET type device 311, provide additional current dissipation that can be realized using the multiple finFET type devices 112, 113, 114, and 115 as shown in FIG. 3.

The resulting integrated circuit chips can be distributed by the fabricator in raw wafer form (that is, as a single wafer that has multiple unpackaged chips), as a bare die, or in a packaged form. In the latter case chip is mounted in a single chip package (such as a plastic carrier, with lead that are affixed to a motherboard or other higher level carrier) or in a multichip package (such as a ceramic carrier that has either or both surface interconnections or buried interconnections). In any case the chip is then integrated with other chips, discreet circuit elements, motherboard, or (b) end product. The end product can be any product that includes integrated circuit chips, ranging from toys and other low-end applications to advanced computer products having a display, a keyboard or other input device, and a central processor.

What is claimed is:

1. A semiconductor device comprising:
a substrate having a first portion being doped with a second doping type and a second portion being doped with a first doping type, the first portion including:
a first trench;
a second trench;
a first fin between the first trench and the second trench; and
the second portion of the substrate including:
a third trench;
a second fin between the second trench and the third trench, the second fin covering a part of the first portion of the substrate and a part of the second portion of the substrate, a first segment of the second fin, the first segment between the second trench and a second segment of the second fin, the second segment of the second fin covering a part of the second portion of the substrate is between the first segment of the second fin and the third trench;
a gate covering at least a part of the first segment and covering at least a part of the first portion of the substrate and a part of the second portion of the substrate; and
wherein the first fin functions as a drain, the first segment of the second fin under the gate functions as a channel, the first segment of the second fin not covered by the gate functions as a float, and the second segment of the second fin not covered by the gate functions as a source.

2. The semiconductor device of claim 1, wherein the first fin and second fin are of substantially similar height and width.

3. The semiconductor device of claim 1, wherein the doping of the first portion and the second portion is at least $10 \times 10^{20}$ cm-3.

4. The semiconductor device of claim 1, wherein the first trench, the second trench, and the third trench have substantially similar depths.

5. The semiconductor device of claim 1, wherein the first trench, the second trench, and the third trench have different depths.

6. The semiconductor device of claim 1, wherein a third fin over the second portion of the substrate is between the third trench and a fourth trench.

7. The semiconductor device of claim 6, wherein the first fin, the second fin, and the third fin share a common centerline.

8. The semiconductor device of claim 6, wherein the third fin functions as a body contact.

9. The semiconductor device of claim 1, wherein a source, a drain and a body contact all reside on different fins.

10. A semiconductor device comprising:
a substrate having a first portion being doped with a second doping type and a second portion being doped with a first doping type, the first portion including:
a first trench;
a second trench; and
a row of first fins between the first trench and the second trench;
the second portion of the substrate including:
a third trench;
a row of second fins between the second trench and the third trench, the row of second fins covering a part of the first portion of the substrate and a part of the second portion of the substrate, a plurality of first segments of the row of second fins, the plurality of first segments between the second trench and a plurality of second segments of the row second fins, the plurality of second segments of the row of second fins covering a part of the second portion of the substrate between the plurality of first segments of the row of second fins and the third trench; and
a gate covering at least a part of the plurality of first segments of the row of second fins and covering at least a part of the first portion of the substrate and a part of the second portion of the substrate.

11. The semiconductor device of claim 10, wherein the row of first fins are electrically connected.

12. The semiconductor device of claim 10, wherein the plurality of first segments of the row of second fins not covered by the gate are electrically connected.

13. The semiconductor device of claim 11, wherein the plurality of second segments of the row of second fins are electrically connected.

14. The semiconductor device of claim 10, wherein a row of third fins is covering a part of the second portion between the third trench and a fourth trench and the row of third fins are electrically connected.

15. The semiconductor device of claim 13, wherein a merged layer of EPI is the electrical connection between the row of first fins and the plurality of second segments of the row of the second fins.

16. The semiconductor device of claim 10, wherein the rows of the first fins and the second fins are substantially parallel to each other and substantially perpendicular to the centerline of each fin.

* * * * *